United States Patent
Melanson (10) Patent No.: US 6,879,275 B1
(45) Date of Patent: Apr. 12, 2005

(54) SIGNAL PROCESSING WITH A LOOK-AHEAD MODULATOR HAVING TIME WEIGHTED ERROR VALUES

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/875,920

(22) Filed: Jun. 24, 2004

Related U.S. Application Data (60) Provisional application No. 60/539,132, filed on Jan. 26, 2004, and provisional application No. 60/537,285, filed on Jan. 16, 2004.

(51) Int. Cl.[7] .............................................. H03M 3/00
(52) U.S. Cl. ...................................................... 341/143
(58) Field of Search ................................ 341/143, 106, 341/50

(56) References Cited

U.S. PATENT DOCUMENTS

| | | | | |
|---|---|---|---|---|
| 5,757,517 | A | * | 5/1998 | Couwenhoven et al. .... 358/463 |
| 6,760,573 | B2 | * | 7/2004 | Subrahmanya et al. .. 455/192.2 |
| 2003/0086366 | A1 | * | 5/2003 | Branlund et al. ........... 370/208 |
| 2003/0231729 | A1 | * | 12/2003 | Chien et al. ................. 375/376 |

FOREIGN PATENT DOCUMENTS

JP 2003-124812 4/2003

OTHER PUBLICATIONS

Angus, James A.S., "Tree Based Lookahead Sigma Delta Modulators," Audio Engineering Society 114th Convention, Convention Paper 5825, Mar. 22–25, 2003.

Harpe, Pieter, et al., "Efficient Trellis–Type Sigma Delta Modulator," Audio Engineering Society 114th Convention, Convention Paper 5845, Mar. 22–25, 2003.

Hawksford, M.O.J., "Parametrically Controlled Noise Shaping in Variable State–Step–Back Pseudo–Trellis SDM," Audio Engineering Society 115th Convention, Convention Paper, Oct. 10–13, 2003.

Kato, Hiroshi, "Trellis Noise–Shaping Converters and 1–bit Digital Audio," Audio Engineering Society 112th Convention, Convention Paper 5615, May 10–13, 2002.

Sony Electronics, Inc. and Philips Electronics N.V., "Super Audio Compact Disc, A Technical Proposal," 1997.

* cited by examiner

*Primary Examiner*—Peguy JeanPierre
(74) *Attorney, Agent, or Firm*—Hamilton & Terrile, LLP; Kent B. Chambers (57) ABSTRACT

A signal processing system includes a look-ahead delta sigma modulator that processes multiple output candidate vectors and an input vector to determine an error vector for each output candidate vector. The error vector is weighted by a weight vector. The weight vector includes, for example, at least one non-unity, non-zero weight element that is different from another weight element to obtain lower signal-to-noise ratios than conventional look-ahead delta-sigma modulators while maintaining linearity associated with the conventional look-ahead delta-sigma modulators. The magnitudes of the weight vector can follow any window function.

52 Claims, 6 Drawing Sheets

SIGNAL PROCESSING WITH A LOOK-AHEAD MODULATOR HAVING TIME WEIGHTED ERROR VALUES

CROSS-REFERENCE TO RELATED APPLICATION

This application claims the benefit under 35 U.S.C. § 119(e) of (i) U.S. Provisional Application No. 60/537,285, filed Jan. 16, 2004 and entitled "Look-Ahead Delta Sigma Modulators" and (ii) U.S. Provisional Application No. 60/539,132, filed Jan. 26, 2004 and entitled "Signal Processing Systems with Look-Ahead Delta-Sigma Modulators". Both provisional applications include example systems and methods and are incorporated by reference in their entireties.

BACKGROUND OF THE INVENTION

1. Field of the Invention

The present invention relates to signal processing and more particularly relates to took-ahead delta-sigma modulators with time weighted error values.

2. Description of the Related Art

Figure 1:
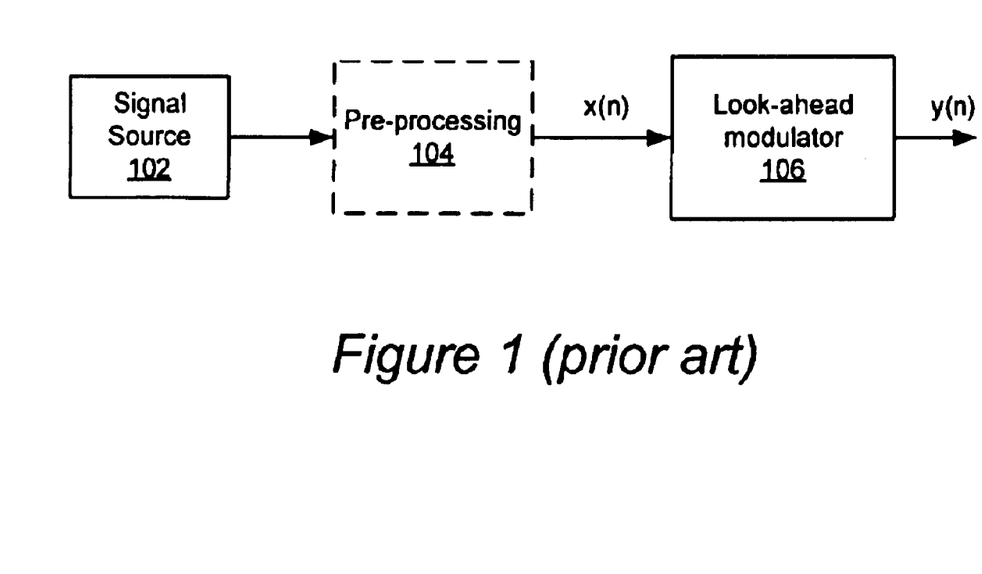
FIG. 1 (prior art) depicts a signal processing system with a conventional look-ahead delta-sigma modulator.

Many signal processing systems implement look-ahead delta-sigma modulators in an attempt to obtain superior input/output signal fidelity by minimizing quantization error. "Delta-sigma modulators" are also commonly referred to using other interchangeable terms such as "sigma-delta modulators", "delta-sigma converters", "sigma delta converters", and "noise shapers". FIG. 1 depicts a prior art signal processing system 100 having a look-ahead delta-sigma modulator 102. Table 1 describes the symbols used in FIG. 1.

TABLE 1

| Symbol | Definition |
| --- | --- |
| x(n) | The nth discrete input signal. |
| $X_t$ | Input signal vector at a time t. |
| y(n) | The nth discrete output signal. |
| $Y_i$ | The ith output candidate vector. |
| $D_i(z)$ | The ith difference vector = $X_t - Y_i$. |
| $C_i$ | The ith cost value vector = $H(D_i(z))$. |
| M | Look-ahead depth. |
| N | $N = k^M$ = The number of output signal candidate sets under consideration, and k = number of possible values for y(n). |
| i | i is selected from the set $\{0, 1, 2, \ldots N-1\}$. |
| $C^{(2)}_i$ | The ith cost value power. |
| $C^{(2)}_{min}$ | The minimum cost value power at time t. |

The signal source 102 provides an input signal to preprocessing components 104. Preprocessing components include an analog-to-digital converter ("ADC") and oversampling components to generate a k-bit, digital input signal x(n). For audio applications, x(n) represents a 44.1 kHz signal with a desired oversampling ratio. Look-ahead modulator 106 quantizes input signal x(n) and shapes the quantization noise so that most of the quantization noise is moved out of the signal band of interest, e.g. approximately 20 kHz for audio applications. Each output signal y(n) generally has one of two values selected from the set $\{+\Delta/2, -\Delta/2\}$ with "Δ" representing the full swing of y(n). (For convenience, Δ/2 will be represented as +1, and −Δ/2 will be represented as −1.). The output signal y(n) can be processed further and, for example, used to drive an audio sound system or can be recorded directly onto a storage medium.

Figure 2:
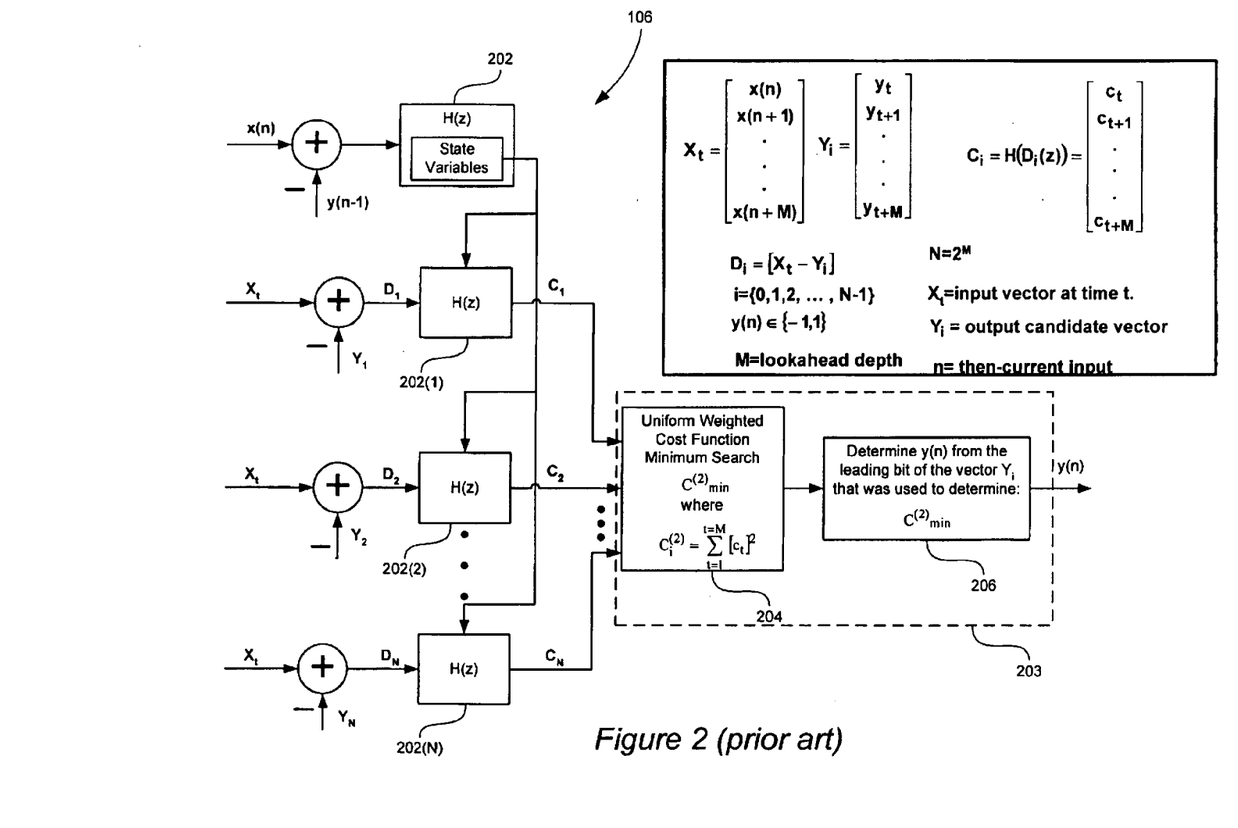
FIG. 2 (prior art) depicts example data used by the look-ahead delta-sigma modulator of FIG. 1 to determine an output signal.

FIG. 2 depicts a schematic representation of prior art look-ahead delta-sigma modulator 106 with a look-ahead depth of M. The look-ahead depth refers to the dimension of each output candidate vector $Y_i$ used to determine output signal y(n). For time t, each output candidate vector $Y_i$, i□{0,1,2, . . . , N−1}, is subtracted from an input vector $X_t$ to obtain respective difference vectors $D_i$, i□{0,1,2, . . . , N−1}, and $D_i=[X_t-Y_i]$. For a look-ahead depth of M and y(n)={−1, +1}, and without pruning output candidates, each of the N output candidate vectors contains a unique set of elements. Each noise-shaping filter 202(i) of look-ahead delta-sigma modulator 106 uses a common set of filter state variables for time t during the calculations of respective cost vectors $C_i$. Filter 202 maintains the actual filter state variables used during the calculation of each y(n). The state variables are updated with the selected y(n) output value. The output of each filter 202(i) is a cost value vector, $C_i$. Cost value vector $C_i=H(D_i(z))$, and, thus, each element of cost value vector $C_i$ is a frequency weighted error value.

Quantizer 203 includes two modules to determine y(n). The cost function minimum search module 204 computes the cost value power, $C_i^{(2)}$, of each cost value $C_i$ in accordance with Equation 1, and determines the minimum cost value power at time t.

$$C_i^{(2)} = \sum_{t=1}^{t=M} [c_t]^2. \qquad \text{Equation 1}$$

"ct" represents a cost value for time t, t=1 through M, in the cost vector $C_i$.

The y(n) selector module 206 selects y(n) as the leading bit of $Y_i$ where $C_i^{(2)}{}_{min}$ represents the minimum cost value power.

For example, if M=2 and y∈{−1,+1}, then N=4, i□{0,1, 2,3}, and Table 2 represents each of the Y output candidate vectors and $X_t$.

TABLE 2

| | $Y_1$ | $Y_2$ | $Y_3$ | $Y_4$ | $X_t$ |
| --- | --- | --- | --- | --- | --- |
| $y_t$ | 0 | 0 | 1 | 1 | x(n) |
| $y_{t+1}$ | 0 | 1 | 0 | 1 | x(n + 1) |

If $C_3^{(2)}$ represents the minimum cost value power, then selector module 206 selects y(n)=1 because the first bit in output candidate vector $Y_3$ (the output candidate vector associated with $C_3^{(2)}$), equals 1. If $C_1^{(2)}$ represents the minimum cost value power, then selector module 206 selects y(n)=0 because the first bit in output candidate vector $Y_1$ (the output candidate vector associated with $C_1^{(2)}$), equals 0.

Conventional research in look-ahead modulators primarily involves two threads. The first are the works of Hiroshi Kato, "Trellis Noise-Shaping Converters and 1-bit Digital Audio," AES 112th Convention, 2002 May 10–13 Munich, and Hiroshi Kato, Japanese Patent JP,2003-124812,A, and further refinements described in Harpe, P., Reefman D., Janssen E., "Efficient Trellis-type Sigma Delta Modulator," AES 114th Convention, 2003 Mar. 22–25 Amsterdam (referred to herein as "Harpe"); James A. S. Angus, "Tree Based Look-ahead Sigma Delta Modulators," AES 114th Convention, 2003 Mar. 22–25 Amsterdam; James A. S. Angus, "Efficient Algorithms for Look-Ahead Sigma-Delta Modulators," AES 155th Convention, 2003 Oct. 10–13 New York; Janssen E., Reefman D., "Advances in Trellis based SDM structures," AES 115th Convention, 2003 Oct. 10–13 New York. This research targets solving the problems of 1-bit encoding of audio data for storage without using the steep anti-alias filters associated with pulse code modulation "PCM." The advent of super audio compact disc "SACD" audio storage, with its moderate oversample ratios (32 or 64), motivated this work.

The second primary thread of look-ahead modulator research involves pulse width modulation ("PWM") amplifiers based on delta-sigma modulators combined with digital PWM modulation stages. The principal researchers have been Peter Craven and John L. Melanson. In U.S. Pat. No. 5,784,017 entitled "Analogue and Digital Converters Using Pulse Edge Modulations with Non-Linear Correction," inventor Peter Craven ("Craven"), which is incorporated herein by reference in its entirety, Craven described the use of look-ahead in delta sigma modulators. The purpose of Craven was to ensure stability in alternating edge modulation, an inherently difficult modulation mode to stabilize. In the PWM case, the delta-sigma modulator is operating at a low oversample ratio (typically 4–16), and quantization noise is a special problem.

Conventional technology has not proposed a reasonable way to find the closest matching output signal sets for each time t directly given that without pruning there are $2^M$ possible reasonable combinations to search and the length of output signals Y[n] for a 1 minute signal is 60*44100*64 (i.e., 60 seconds, 44.1 kHz sampling frequency, and 64:1 oversample ratio). Trellis searches, tree searches, and pruning have all been proposed as solutions to reducing the computation.

As discussed in Harpe, page 5, conventional look-ahead delta-sigma modulators demonstrate improved linearity over standard (non-look-ahead) delta-sigma modulators. However, Harpe also observes on page 5 that in all cases the signal-to-noise ratio of Trellis architecture look-ahead delta-sigma modulators is several dB worse when compared to standard delta-sigma-modulators.

SUMMARY OF THE INVENTION

One embodiment of the present invention includes a look-ahead modulator in a digital signal system. The delta sigma modulator includes an error generator to determine a set of error vectors for each set of M element modulator output candidate vectors, wherein M is greater than one and each element in the output candidate vectors is a potential output value of the delta sigma modulator and an error weighting component to weight in the time-domain at least one element of at least one of the error vectors using a weight vector that includes at least one non-zero weight element that is different from another non-zero weight element. The error values can be the power outputs of a noise shaping filter in a delta-sigma look-ahead modulator. The modulator further includes an output value generator to select from each set of error vectors weighted by the error weighting component an error vector associated with a modulator output candidate vector and to select an output value from the associated modulator output candidate vector.

The magnitudes of a weight vector can follow, for example, any window function. For example, the magnitudes of the weight vector can trend downward as a look-ahead depth of the error values increase. The magnitudes of the weights can also decrease linearly. The magnitudes of the weights can decrease exponentially. The magnitudes of the weights can remain the same for each set of M modulator output candidates. The look-ahead modulator can determine error vectors for a depth of M modulator output candidates, wherein M is greater than one. In at least one embodiment of the look-ahead modulator, each output candidate has two possible values, and the selected set of error values comprises $2^M$ sets of error values. The selected error vector can represent a vector of M output candidates that are the closest matching in a signal band of interest, and the output value can represent the leading bit of the M modulator output candidates. The error generator can include a noise-shaping filter and output values are selected using error vectors that are the closest matching in a signal band having a lowest cumulative total power out of the filter. The look-ahead modulator can be any type of delta-sigma modulator including a Trellis type delta-sigma modulator and a tree-based delta-sigma modulator. In at least one embodiment of the look-ahead modulator, the error value weighting component is implemented using software.

In another embodiment of the present invention, a method of determining output values of a delta sigma modulator using weighted error vectors includes generating error vectors for each set of M element output candidate vectors and an M element modulator input vector, wherein M is greater than one and each element in the output candidate vectors is a potential output value of the delta sigma modulator. The method further includes weighting in the time-domain at least two elements of the error vectors with different, non-zero weights. The method further includes selecting from each set of weighted error vectors an error vector associated with one of the modulator output candidate vectors and generating an output from the associated modulator output candidate vector.

In another embodiment of the present invention, a signal processing system can include an M-depth delta-sigma modulator to determine output values from respective sets of M element modulator output candidate vectors and an M element modulator input vector using frequency weighted and time weighted error vectors, wherein M is greater than one, each element in the output candidate vectors is a potential output value of the delta sigma modulator, and at least one non-zero element of each weight vector is different than at least one other non-zero element of the weight vector. The signal processing system can also include a difference module to determine a difference between each set of M input values and each trial set of M output candidate values, a noise shaping filter to frequency weight the difference between each of the input values and a corresponding output candidate value, and a time domain weighting module to weight at least one of the error values differently than at least one other error value. The signal processing system can also include a storage medium encoded with information derived from the output values.

In another embodiment of the present invention, a method of determining an output signal using an M-depth delta sigma modulator and weighted error vectors, wherein M is greater than one and each element in the output candidate vectors is a potential output value of the delta sigma modulator. The method further includes for each processed input signal vector and output candidate vector, generating a cost function vector, for each cost function vector and computing an error vector from the cost function vector and a weight vector, wherein the weight vector includes at least one non-zero, non-unity element that is different from at least one other element of the weight vector. The method further includes processing each error vector to identify the output candidate vector that best matches the input signal vector and selecting an output value from the output candidate vector that best matches the input signal vector.

In another embodiment of the present invention, a method of processing a signal using a delta sigma modulator includes determining output values of an M-depth delta sigma modulator from respective sets of M element modulator output candidate vectors and an M element modulator input vector using frequency weighted and time weighted error vectors, wherein M is greater than one, each element in the output candidate vectors is a potential output value of the delta sigma modulator, and at least one non-zero element of each weight vector is different than at least one other non-zero element of the weight vector.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

There are at least two different interesting characteristics at issue with look-ahead delta-sigma modulators. The first is quantization error along with the desire to minimize the error and remove signal dependent quantization noise. As discussed in the Background section, most prior publications have shown an increase in in-band noise when using look-ahead modulators. The second issue involves loop stability.

With greater loop stability, more aggressive noise shaping can be used to drive down the in-band noise. Look-ahead modulators can be designed using technology described herein to make better average choices in most circumstances, thereby reducing in-band noise without resorting to changing the noise shaping filter.

Although conventional look-ahead delta-sigma modulators comprise in-band noise for greater stability, the look-ahead delta-sigma modulator described herein can maintain the superior linearity of a look-ahead delta-sigma modulator while achieving the unexpected result of lower in-band noise relative to conventional look-ahead delta-sigma modulators and conventional non-look-ahead delta-sigma modulators and improved total harmonic distortion ("THD"). The look-ahead delta-sigma modulators of the signal processing system described herein weight elements of error vectors with at least one non-zero, non-unity weight (i.e., not equal to 1) to obtain lower signal-to-noise ratios than conventional look-ahead delta-sigma modulators while maintaining linearity associated with the conventional look-ahead delta-sigma modulators.

In one embodiment, a signal processing system includes a look-ahead delta sigma modulator that processes multiple output candidate vectors and an input vector to determine an error vector for each output candidate vector. The error vector is weighted by a weight vector. The weight vector includes, for example, at least one non-zero weight element that is different from another weight element value or at least one non-unity, non-zero weight value. Weighting the error vector can be accomplished by determining the dot product of the error vector and the time-domain weight vector. Each element of the time-domain weighted error vector can be derived from the output candidate vectors and input vector in any number of ways. For example, each error value vector can represent a cost value vector determined from a filtered output of the difference between an output candidate vector and input vector, each error value vector can represent the difference between the cost value vector and an output candidate vector, and so on.

The elements of the weight vector are a matter of design choice and are generally chosen empirically to minimize output signal noise. In one embodiment, the elements of the weight vector trend downward in the time-domain.

Multiple error vectors are determined by changing the values of the output candidate vector. For example, for an M-depth output candidate vector, if each element has two possible values, then there are up to $2^M$ possible output candidate vectors. The number of output candidate vectors can be pruned by, for example, eliminating or reducing redundant arithmetic operations. Selection of an output value for the look-ahead delta-sigma modulator can be based upon any of a number of techniques. For example, the time-domain weighted error vector having the minimum power can be used to select an output value for the look-ahead delta-sigma modulator, or the time-domain weighted error vector minus a corresponding output candidate vector having a minimum power can also be used.

Figure 3:
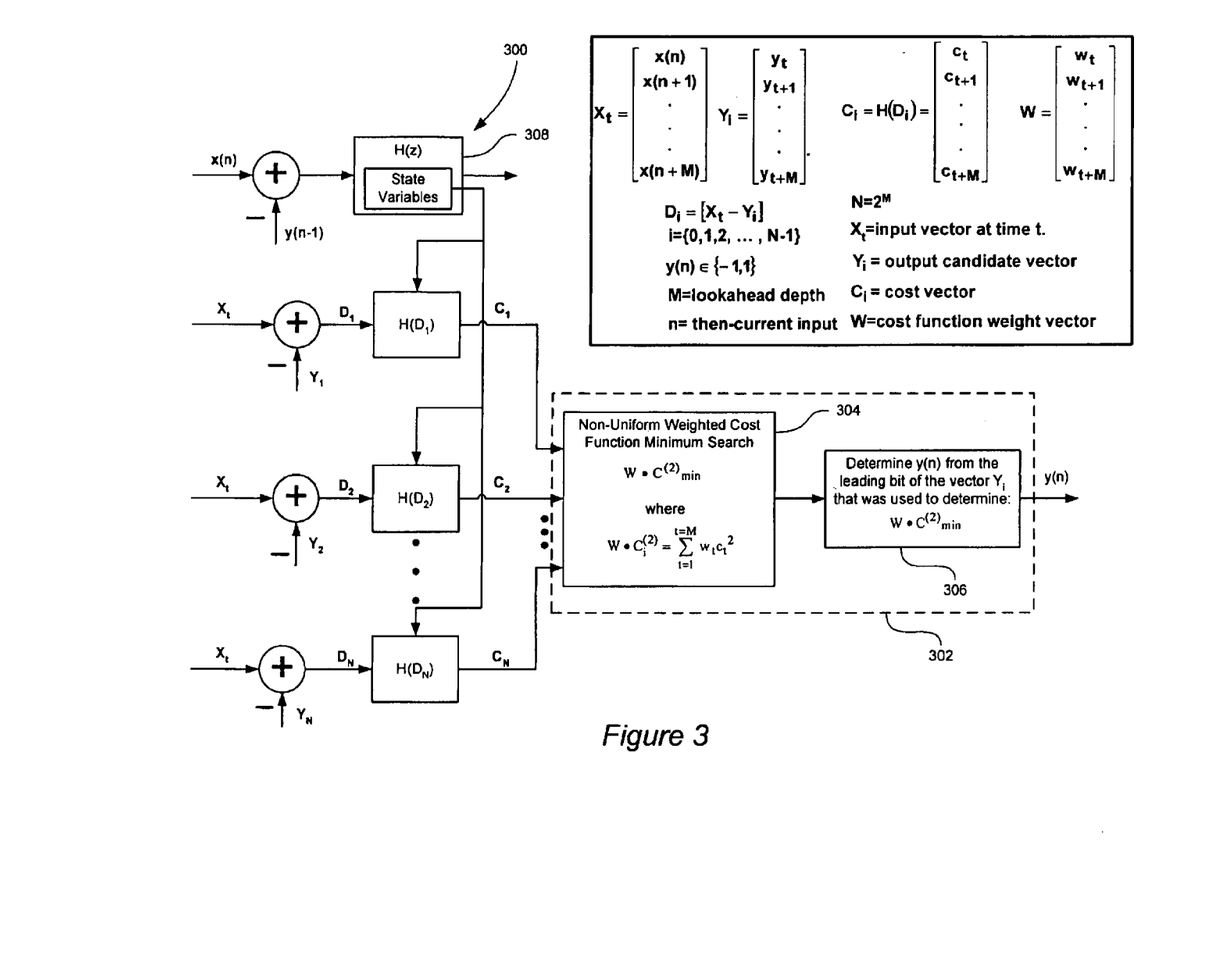
FIG. 3 depicts a signal processing system having a look-ahead delta-sigma modulator and weighted cost values.

In one embodiment, the signal processing system 300 processes a discrete-time, over-sampled input signal pattern, X[n], and determines the best output signal pattern Y[n] to approximate X[n] in a signal bandwidth, X[n]=$x_1$, $x_2$, $x_3$, . . . and Y[n]=$y_1$, $y_2$, $y_3$, . . . "Best" can be defined as closest matching in the signal band of interest. "Closest matching" can be defined, for example, in a power sense (lowest distance), in a minimum/maximum sense, in a psycho-acoustically weighted sense, other desired measure. Thus, in one embodiment, the "best" output signal pattern Y[n] is the pattern Y[n] such that H(X-Y) has the lowest power. A "signal band of interest" is, for example, a frequency band containing a signal with data of interest. For example, an audio signal band of interest is approximately 0 Hz to 25 kHz. It will be apparent to those of ordinary skill in the art that the signal processing system described herein can be adapted to determine the best, closest matching output signal pattern under varying constraints and are not limited to the constraints of "best" and "closest matching" set forth herein, but rather constraints can be defined to accomplish desired goals.

FIG. 3 depicts a look-ahead delta-sigma modulator 300 that uses weighted cost functions to determine each output y(n). Except for the operation of quantizer 302, look-ahead delta-sigma modulator 300 functions identically to look-ahead delta-sigma modulator 106. Quantizer 302 includes a non-uniform weighted cost function minimum search module 304 that computes a scalar, weighted cost value power, $W \cdot C_i^{(2)}$, using the conventional cost value power and a weight cost function vector W for i□{0,1,2, . . . , N−1}. Search module 304 computes $W \cdot C_i^{(2)}$ in accordance with Equation 2:

$$W \cdot C_i^{(2)} = \sum_{t=1}^{t=M} w_t c_t^2 \qquad \text{Equation 2}$$

"$c_t$" represents a cost value for time t in the cost vector $C_i$, and $w_t$ represents a weight for time t in the weight cost function vector W. Vector W represents one embodiment of a weight vector. Each element of cost value vector $C_i$ represents an error value, and $C_i$ represents one embodiment of an error vector. In one embodiment, each error value represents an error between an input signal and an output signal candidate. The y(n) selector module 306 of quantizer 302 selects y(n) as the leading bit of $Y_i$. "$W \cdot C_i^{(2)}{}_{min}$" represents the minimum weighted cost value power. Thus, since $C_i$ represents one embodiment of a set of frequency weighted error values, quantizer 302 determines an output value, y(n) from a set of time weighted; frequency weighted error values. The determined output value, y(n), is fed back to filter 308. In a digital embodiment, the feedback of output value y(n) updates the state variables of the filter 308.

For example, if M=2 and y∈{−1,+1}, then N=4, i□{0,1, 2,3}, and Table 2 represents each of the Y output candidate vectors, $X_t$, and W.

TABLE 3

|        | $Y_1$ | $Y_2$ | $Y_3$ | $Y_4$ | $X_t$    | W         |
|--------|-------|-------|-------|-------|----------|-----------|
| $y_t$  | 0     | 0     | 1     | 1     | x(n)     | $w_t$     |
| $y_{t+1}$ | 0  | 1     | 0     | 1     | x(n + 1) | $w_{t+1}$ |

If $W \cdot C_3^{(2)}$ represents the minimum cost value power, then selector module 306 selects y(n)=1 because the first bit in output candidate vector $Y_3$ (the output candidate vector associated with $W \cdot C_3^{(2)}$), equals 1. If $W \cdot C_1^{(2)}$ represents the minimum cost value power, then selector module 306 selects y(n)=0 because the first bit in output candidate vector $Y_1$ (the output candidate vector associated with $W \cdot C_1^{(2)}$), equals 0. This example can be extrapolated to cover any look-ahead depth and number of output candidate sets.

Thus, if look-ahead modulator 300 looks ahead 10 decisions (i.e., depth M=10) using one decision bit (i.e., y∈{−1,+1}) and advancing periodically in time, at each time point 1024 distances must be calculated (assuming no pruning). If search module 304 is locating the best Y[0], then all possible Y[0] Y[1] . . . Y[9] will be tried. On the next step, search module 304 will search for the best Y[1] by searching on the set {Y[1], Y[2], . . . Y[10]}. For a conventional (unity weighted look-ahead delta-sigma modulators) the first search Y[0] through Y[9] has a weight 1 and Y[10] Y[END] have weight=0, as they are not included in the process of determining Y[0]. A conventional unity weight vector can be represented by a unity valued rectangular weighting window. This rectangular weighting window causes the same windowing effects as rectangular windows in spectral analysis, and the result is a relatively poor quality solution. "Window" and "windowing" refer to the profile of the weights as, for example, represented in FIGS. 4A–4F.

However, weighting using selected nonuniform weights, such as a downward trending weight vector, decreases the aliasing due to truncation of the sample set, and improves the signal-to-noise ratio of the look-ahead delta-sigma modulator 300.

Figure 4A:
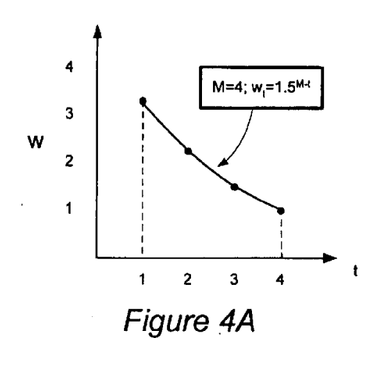
FIGS. 4A–4F depict weighting windows with a downward weighting trend.
Figure 4B:
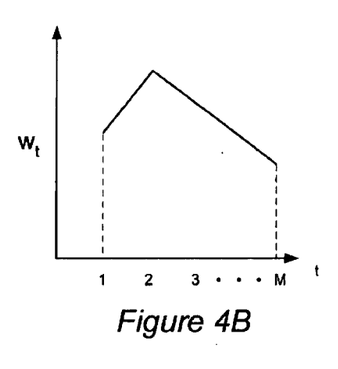
Figure 4C:
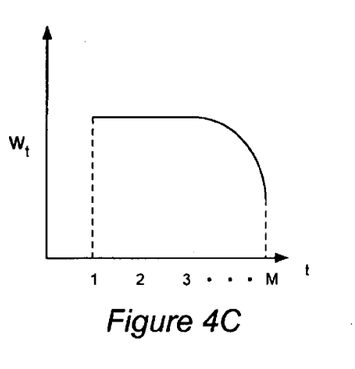
Figure 4D:
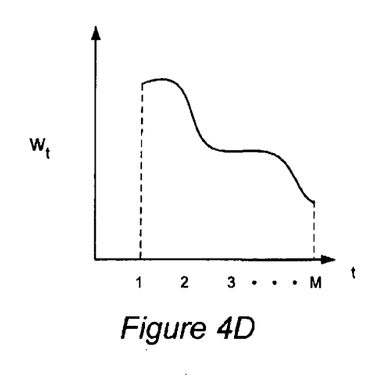
Figure 4E:
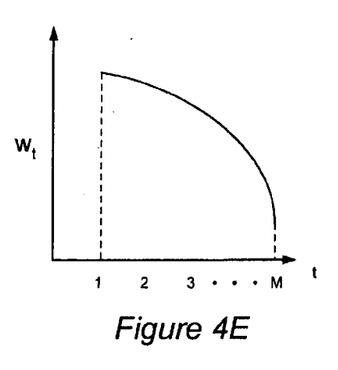
Figure 4F:
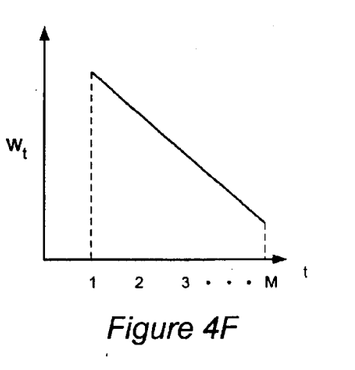

FIGS. 4A–4F (collectively "FIG. 4") depict various exemplary weight vectors applied by the non-uniform weighted cost function minimum search module 304. FIG. 4 depicts the weight vectors as windows that weight each set of cost value powers and depicts exemplary weighting windows with a downward weighting trend. In FIG. 4A, the depth equals 4 and the elements of the weight vector equal $W_t = 1.5^{M-1-t}$. Thus, the window is exponential in nature. If $w_t = 1.5$, the earliest cost value output would be weighted 3.375 times as much as the last cost value output. As FIG. 4 illustrates, any variety of windows can be used with look-ahead delta-sigma modulator 300. Exponential windows are generally the easiest to implement with Trellis delta-sigma modulators.

A tapered weight vector applied before summing the power in the search module 304 solves the quality problem associated with unity weighting and improves both the signal-to-noise ratio and THD. Weighting windows similar to FIG. 4C, having weight vector W=[1.0, 1.0, 1.0, 1.0, 1.0, 0.92, 0.80, 0.70, 0.52, 0.24], perform well for a depth of 10. The window depicted in FIG. 4C can be difficult to implement in a look-ahead system that re-uses prior cost computations, as Trellis and tree structures often do. An exponentially decaying window such as the window of FIG. 4A can be exploited in these cases. The results obtained using advantages of the rectangular window have empirically fallen short of empirical results obtained using the convex type of taper shown in FIG. 4A. Weight elements, $w_t$, in a weight vector W can also be defined to be within particular ranges. For example, a weight vector can be defined as W=[$w_0, w_1, w_2, w_3, \ldots$], where w0, w1, and w2 have values within approximately +/−5% of each other and w3 is approximately 80% or less of $w_0, w_1$, or $w_2$. The best window for a particular depth and application can be determined empirically.

Conventional look-ahead delta-sigma modulators use the minimum cost value power value, $C_i^{(2)}{}_{min}$ as determined by Equation 1. This determination effectively drives the inputs to quantizer 203 to small values and, thus, effectively increases the loop gain of look-ahead delta-sigma modulator 106.

Figure 5:
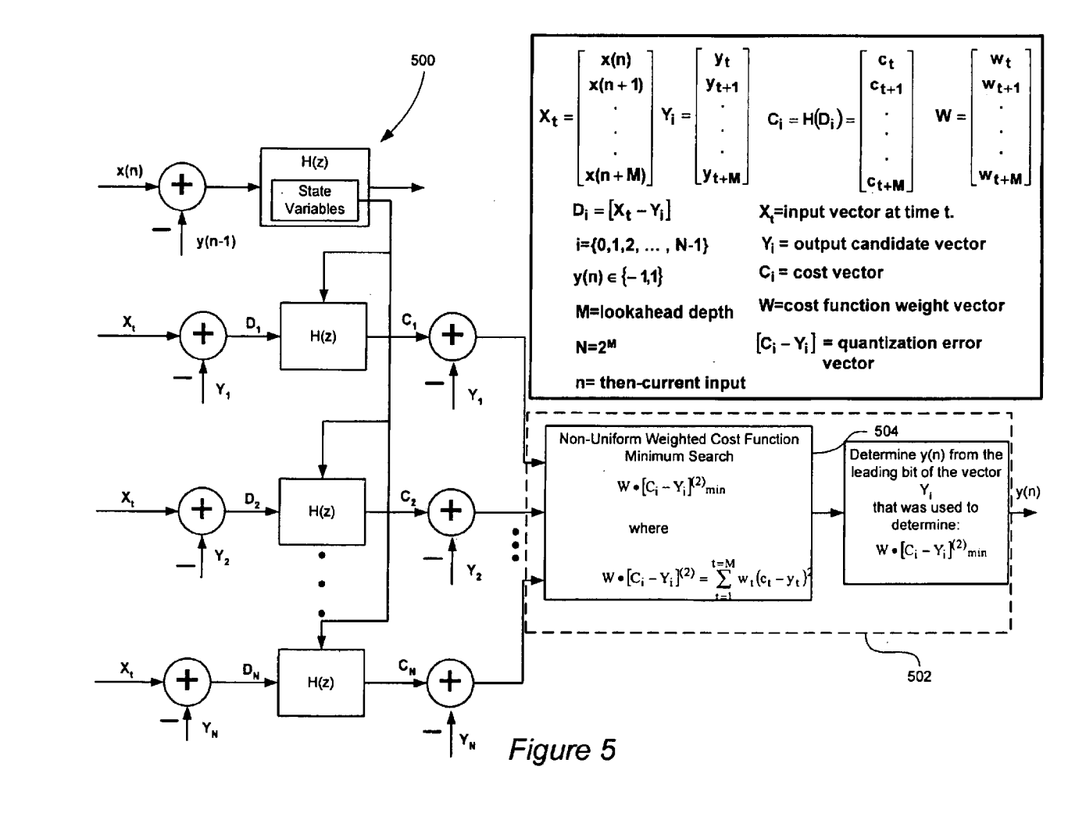
FIG. 5 depicts a signal processing system having a look-ahead delta-sigma modulator and weighted cost values.

Referring to FIG. 5, look-ahead delta-sigma modulator 500 represents another embodiment of a look-ahead delta-sigma modulator using time weighted, frequency weighted error values. The look-ahead delta-sigma modulator 500 is identical to look-ahead delta-sigma modulator 300 except for quantizer 502. The non-uniform weighted cost function minimum search module 504 minimizes the scalar, power of the weighted difference between the cost vector $C_i$ and the output candidate vector $Y_i$ for i□{0,1,2, . . . , N−1}. Search module 304 computes $W \cdot [C_i - Y_i]^{(2)}$ in accordance with Equation 3:

$$W \cdot [C_i - Y_i]^{(2)} = \sum_{t=1}^{t=M} w_t (c_t - y_t)^2 \qquad \text{Equation 3}$$

"$c_t$" represents a cost value for time t, t=1 through M, in the cost vector $C_i$, $w_t$ represents a weight for time t in the weight cost function vector W, and $y_t$ represents an output candidate for time t in the cost vector $Y_i$. Vector W represents one embodiment of a weight vector. The y(n) selector module 506 selects y(n) as the leading bit of $Y_i$. "$W \cdot [C_i - Y_i]^{(2)}{}_{min}$" represents the minimum weighted, quantizer input/output difference power. "$[C_i - Y_i]$" represents one embodiment of an error vector with frequency weighted elements, and quantizer 502 determines an output value, y(n) from a set of time weighted, frequency weighted error values.

When minimizing the difference between the weighted difference between the input and the output candidate values of quantizer 502, quantizer 502 has a defined gain. Additionally, the demonstrated signal-to-noise ratio of look-ahead delta-sigma modulator 500 exhibits in some cases a 10 dB improvement over conventional look-ahead delta-sigma modulators.

Figure 6:
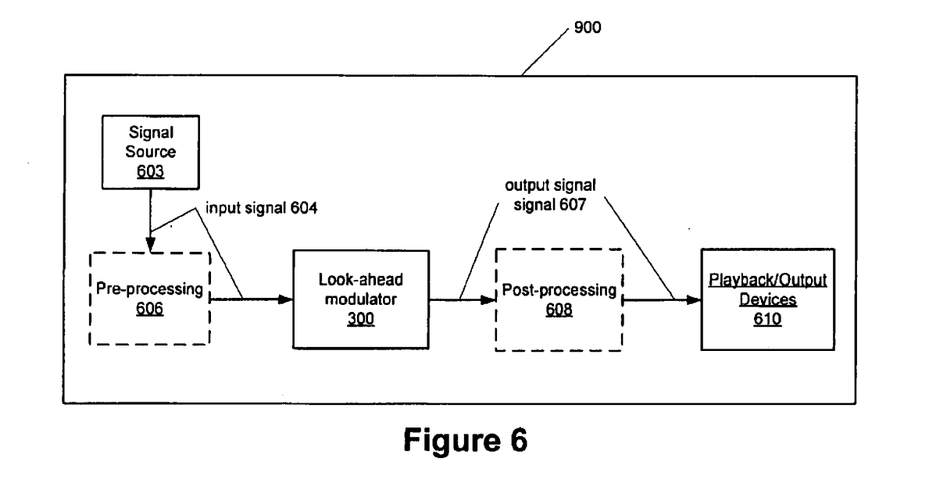
FIG. 6 depicts a signal processing system that includes a look-ahead modulator of FIG. 3, an output device and process, and an output medium.

Referring to FIG. 6, signal processing system 600 depicts one embodiment of a signal processing system that includes look-ahead modulator 300. Signal processing system 600 is particularly useful for high-end audio applications such as super audio compact disk ("SACD") recording applications. Signal processing system 600 processes an input signal 604 generated by an input signal source 603. The input signal 604 may be digital or analog and may be from any signal source including signals generated as part of a recording/mixing process or other high end audio sources or from lower-end sources such as a compact disk player, MP3 player, audio/video system, audio tape player, or other signal recording and/or playback device.

The input signal 604 may be an audio signal, a video signal, an audio plus video signal, and/or other signal type. Generally, input signal 604 undergoes some preprocessing 606 prior to being modulated by look-ahead modulator 602. For example, pre-processing 606 can involve an interpolation filter to oversample a digital input signal 604 in a well-known manner. Pre-processing 606 can include an analog-to-digital converter to convert an analog input signal 604 into a digital signal. Pre-processing 606 can also include mixing, reverberation, equalization, editing, out-of-band noise filtering and other filtering operations.

In the digital domain, pre-processing 606 provides discrete input signals X[n] to look-ahead modulator 702. Each discrete input signal x[n] is a K-bit signal, where K is greater than one. As previously described in more detail, look-ahead modulator 302 processes input signals X[n] and candidates Y[n] to determine an output signal 607. Output signal 607 is, for example, a collection of one-bit output values. The output signal 607, thus, becomes an encoded version of the input signal 604.

Figure 7:
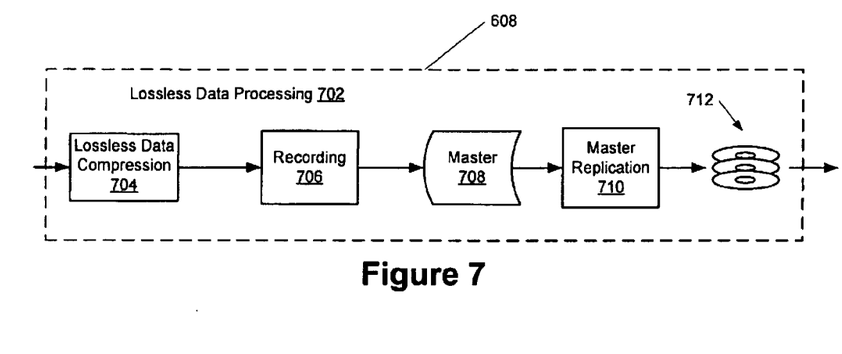
FIG. 7 depicts post-processing operations in an embodiment of the signal processing system of FIG. 6.

Referring to FIGS. 6 and 7, signal processing system 600 typically includes post-processing 608 to post-process the output signal 607 of look-ahead modulator 302. Post-processing 608 can include lossless data processing 702. For SACD audio mastering, there is a lossless data compression stage 704, followed by a recording process 706 that produces the actual pits that are burned into a master storage medium 708. The master storage medium 708 is then mechanically replicated to make the disks (or other storage media) 712 available for widespread distribution. Disks 712 are, for example, any variety of digital versatile disk, a compact disk, tape, or super audio compact disk. Playback/output devices 610 read the data from the disks 712 and provide a signal output in a format perceptible to users. Playback/output devices 610 can be any output devices capable of utilizing the output signal 607. Thus, the storage media 708 and 712 include data encoded using signal modulation processes achieved using look-ahead modulator 300.

For example, in addition to utilizing any of a variety of weight vectors, different weight vectors can be used for each candidate set of error values. Additionally, look-ahead modulators with weighted-error values can be implemented using any type of look-ahead delta-sigma modulator and in conjunction with other look-ahead techniques such as pruning techniques. Pruning techniques include eliminating or reducing processing of redundant cost value vectors and eliminating or reducing redundant arithmetic calculations.

Many systems can implement look-ahead delta-sigma modulator 300. For example, the weighting of look-ahead delta-sigma modulator 302 can be implemented using hardware and/or software.

Although the present invention has been described in detail, it should be understood that various changes, substitutions and alterations can be made hereto without departing from the spirit and scope of the invention as defined by the appended claims.

What is claimed is:

1. A delta sigma modulator comprising:
   an error generator to determine a set of error vectors for each set of M element modulator output candidate vectors, wherein M is greater than one and each element in the output candidate vectors is a potential output value of the delta sigma modulator;
   an error weighting component to weight in the time-domain at least one element of at least one of the error vectors using a weight vector that includes at least one non-zero weight element that is different from another non-zero weight element; and
   an output value generator to select from each set of error vectors weighted by the error weighting component an error vector associated with a modulator output candidate vector and to select an output value from the associated modulator output candidate vector.

2. The delta sigma modulator of claim 1 further comprising:
   a digital filter to filter data derived from input signal data and respective elements of the output candidate vectors and to provide the filtered data to the error generator, wherein the digital filter includes state variables that are updated via feedback of the selected output value.

3. The delta sigma modulator of claim 1 wherein the error generator determines one error vector for each output candidate vector.

4. The delta sigma modulator of claim 1 wherein magnitudes of each non-zero weight element of the weight vector trend downward as a lookahead depth of the error values increase.

5. The delta sigma modulator of claim 1 wherein the magnitudes of each non-zero weight element of the weight vector decrease linearly.

6. The delta sigma modulator of claim 1 wherein the magnitudes of each non-zero weight element of the weight vector decrease exponentially.

7. The delta sigma modulator of claim 1 wherein the weight vector that includes elements [$w_0, w_1, w_2, w_3, \ldots$], wherein w0, w1, and w2 have magnitudes within approximately +/−5% of each other and w3 has a magnitude of approximately 80% or less of the magnitude of one of the previous elements.

8. The delta sigma modulator of claim 1 further comprising a recording system to store output values generated by the output value generator.

9. The delta sigma modulator of claim 1 further comprising a storage medium having the output values encoded thereon.

10. The delta sigma modulator of claim 1 further comprising a storage medium having data derived from the output values encoded thereon.

11. The delta sigma modulator of claim 1 wherein the magnitudes of each weight element of the weight vector remain the same for each set of M modulator output candidates.

12. The delta sigma modulator of claim 1 wherein the set of error vectors determined by the error generator equals $2^M$.

13. The delta sigma modulator of claim 1 wherein the set of error vectors determined by the error generator is a non-redundant set and contains less than $2^M$ error vectors.

14. The delta sigma modulator of claim 1 wherein each element of each modulator output candidate vector has two possible values.

15. The delta sigma modulator of claim 1 wherein the delta sigma modulator is a Trellis type delta-sigma modulator.

16. The delta sigma modulator of claim 1 wherein the delta sigma modulator is a tree-based delta-sigma modulator.

17. The delta sigma modulator of claim 1 wherein a set of Y output values most closely represent a corresponding set of Y input values in a signal band of interest, wherein Y is a positive integer.

18. The delta sigma modulator of claim 17 wherein each output value represents a leading bit of each modulator output candidate associated with each identified error vector.

19. The delta sigma modulator of claim 17 wherein the error generator comprises a noise-shaping filter and each identified error vector has a lowest cumulative weighted power out of the filter in comparison to the remaining error vectors in the set.

20. The delta sigma modulator of claim 1 wherein to weight in the time-domain at least one element of at least one of the error vectors using the weight vector comprises computing a dot product of the error vector(s) and the weight vector.

21. The delta sigma modulator of claim 1 wherein the error value weighting component is implemented using software.

22. The delta sigma modulator of claim 1 further comprising:
   a quantizer, wherein the $i^{th}$ error vector in the set of error vectors comprises a difference between an $i^{th}$ quantizer input vector and the $i^{th}$ modulator output candidate vector.

23. The delta sigma modulator of claim 22 wherein the $i^{th}$ quantizer input vector comprises a filtered difference between the modulator input vector and the $i^{th}$ modulator output candidate vector.

24. A method of determining output values of a delta sigma modulator using weighted error vectors, the method comprising:
   (a) generating error vectors for each set of M element output candidate vectors and an M element modulator input vector, wherein M is greater than one and each element in the output candidate vectors is a potential output value of the delta sigma modulator;
   (b) weighting in the time-domain at least two elements of the error vectors with different, non-zero weights;
   (c) selecting from each set of error vectors weighted in (b) an error vector associated with one of the modulator output candidate vectors; and
   (d) generating an output value from the associated modulator output candidate vector.

25. The method of claim 24 further comprising:
   filtering data derived from input signal data and respective elements of the output candidate vectors;
   providing the filtered data to an error generator to generate the error vectors;
   feeding back each output value to a filter that filters the data derived from input signal data and respective elements of the output candidate vectors; and
   updating state variables of the filter with the output values fed back to the filter.

26. The method of claim 24 further comprising generating one error vector for each output candidate vector.

27. The method of claim 24 further comprising repeating (a), (b), (c), and (d) for each of a plurality of input values to the delta sigma modulator.

28. The method of claim 27 wherein a set of Y output values most closely represent a corresponding set of Y input values in a signal band of interest, wherein Y is a positive integer.

29. The method of claim 24 further comprising:
   recording data derived from the output values on storage media.

30. The method of claim 24 further comprising:
   recording the output values on a storage media.

31. The method of claim 24 wherein weighting in the time-domain at least two elements of the error vectors comprises computing a dot product of each error vector and a weight vector.

32. The method of claim 24 wherein weighting in the time-domain at least two elements of the error vectors comprises weighting with a weight vector having non-zero elements that trend downward as a lookahead depth of the error values increase.

33. The method of claim 24 wherein weighting in the time-domain at least two elements of the error vectors comprises weighting with a weight vector having non-zero elements that decrease linearly.

34. The method of claim 24 wherein weighting in the time-domain at least two elements of the error vectors comprises weighting with a weight vector having non-zero elements that decrease exponentially.

35. The method of claim 24 wherein weighting in the time-domain at least two elements of the error vectors comprises weighting with a weight vector that includes elements $[w_0, w_1, w_2, w_3, \ldots]$, wherein $w_0$, $w_1$, and $w_2$ have magnitudes within approximately +/−5% of each other and w3 has a magnitude of approximately 80% or less of the magnitude of one of the previous elements.

36. The method of claim 24 wherein weighting in the time-domain at least two elements of the error vectors comprises weighting with a weight vector having elements that remain the same for each set of M modulator output candidates.

37. The method of claim 24 wherein generating error vectors comprises generating $2^M$ error vectors.

38. The method of claim 24 wherein generating error vectors comprises generating a nonredundant set that contains less than $2^M$ error vectors.

39. The method of claim 24 wherein each element of each modulator output candidate vector has two possible values.

40. The method of claim 24 wherein the delta sigma modulator is a Trellis type delta-sigma modulator.

41. The method of claim 24 wherein the delta sigma modulator is a tree-based delta-sigma modulator.

42. The method of claim 41 wherein each output value represents a leading bit of each modulator output candidate associated with each identified error vector.

43. The method of claim 41 wherein:
   generating each error vector comprises:
      generating a difference vector by determining a difference between one of the M element modulator output candidate vectors and one of the M element modulator input vectors; and
      filtering the difference vector; and
   the error generator comprises a noise-shaping filter and each identified error vector has a lowest cumulative weighted power out of the filter in comparison to the remaining error vectors in the set.

44. The method of claim 43 wherein generating an output value from the associated modulator output candidate vector comprises identifying the error vector having a lowest cumulative weighted power out of the filter in comparison to the remaining error vectors.

45. The method of claim 24 wherein the error value weighting component is implemented using software.

46. The method of claim 24 wherein the delta sigma modulator comprises a quantizer and generating error vectors comprises:

for the $i^{th}$ error vector, determining a difference between an $i^{th}$ quantizer input vector and the $i^{th}$ modulator output candidate vector.

47. The method of claim 46 wherein the $i^{th}$ quantizer input vector comprises a filtered difference between the modulator input vector and the $i^{th}$ modulator output candidate vector.

48. A signal processing system comprising:

an M-depth delta-sigma modulator delta sigma modulator to determine output values from respective sets of M element modulator output candidate vectors using error vectors that are frequency weighted and time weighted using one or more weight vectors, wherein M is greater than one, each element in the output candidate vectors is a potential output value of the delta sigma modulator, and at least one non-zero element of each weight vector is different than at least one other non-zero element of the weight vector.

49. The signal processing system of claim 48 further comprising:

a difference module to determine a difference vector corresponding to a difference between an input vector and the set of modulator output candidate vectors;

a digital filter to determine a cost function vector from each difference vector; and a weighting module to weight one or more elements of each cost function vector with at least one weight vector.

50. The signal processing system of claim 48 further comprising:

a storage medium encoded with the output values.

51. A method of determining an output signal using an M-depth delta sigma modulator and weighted error vectors, wherein M is greater than one and each element in the output candidate vectors is a potential output value of the delta sigma modulator, the method comprising:

processing an input signal vector and a set of output candidate vectors;

for each processed input signal vector and output candidate vector, generating a cost function vector;

for each cost function vector, computing an error vector from the cost function vector and a weight vector, wherein the weight vector includes at least-one non-zero, element that is different from at least one other element of the weight vector;

processing each error vector to identify the output candidate vector that best matches the input signal vector; and selecting an output value from the output candidate vector that best matches the input signal vector.

52. A method of processing a signal using a delta sigma modulator, the method comprising:

determining output values of an M-depth delta sigma modulator from respective sets of M element modulator output candidate vectors and an M element modulator input vector using error vectors weighted by one or more weight vectors, wherein M is greater than one, each element in the output candidate vectors is a potential output value of the delta sigma modulator, and at least one non-zero element of each weight vector is different than at least one other non-zero element of the weight vector.

* * * * *

UNITED STATES PATENT AND TRADEMARK OFFICE
CERTIFICATE OF CORRECTION

PATENT NO. : 6,879,275 B1
DATED : April 12, 2005
INVENTOR(S) : John L. Melanson

It is certified that error appears in the above-identified patent and that said Letters Patent is hereby corrected as shown below:

Column 1,
Line 20, "took-ahead" should be -- look-ahead --.

Signed and Sealed this

Twenty-seventh Day of September, 2005

JON W. DUDAS
*Director of the United States Patent and Trademark Office*